United States Patent

Fenner et al.

[15] 3,651,567

[45] Mar. 28, 1972

[54] ELECTRICAL COMPONENTS

[72] Inventors: John A. Fenner, Ilford, Essex; William L. Welman, Ilford, both of England

[73] Assignee: The Plessey Company Limited, Ilford, England

[22] Filed: June 13, 1969

[21] Appl. No.: 833,088

[30] Foreign Application Priority Data

June 14, 1968 Great Britain ......................28,573/68

[52] U.S. Cl. ..................................29/625, 101/426, 29/627
[51] Int. Cl. ......................................B41m 3/08, H05k 3/00
[58] Field of Search ............................29/625, 627; 101/426

[56] References Cited

UNITED STATES PATENTS

| | | | |
|---|---|---|---|
| 2,757,443 | 8/1956 | Steigerwalt | 29/625 |
| 3,505,139 | 4/1970 | Wentworth | 29/625 |
| 3,079,672 | 3/1963 | Bain, Jr. et al. | 29/627 |

*Primary Examiner*—John F. Campbell
*Assistant Examiner*—Donald P. Rooney
*Attorney*—Scrivener, Parker, Scrivener & Clarke

[57] ABSTRACT

An electrical or electronic component including a substrate carrying an electrically conductive film, the film having been laid down by a dry printing process. This process uses a heated die and a thin plastics foil carrying a metal layer a portion of which layer is embossed onto the substrate to give the required film.

4 Claims, 4 Drawing Figures

ELECTRICAL COMPONENTS

Figure 1:
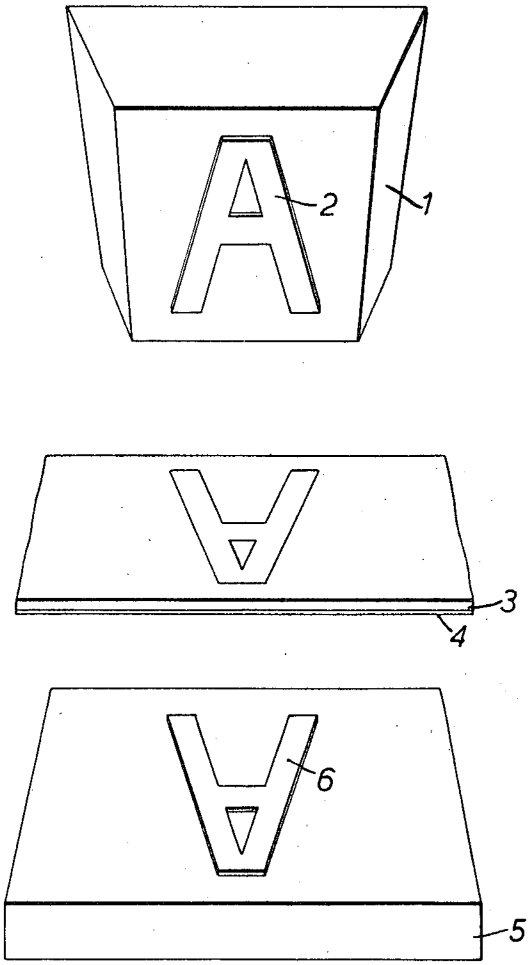

This invention relates to electrical components and is specifically directed to the provision of an electrical or electronic component including a thin electrically conductive film supported on a substrate.

In the preparation of certain electrical components such as capacitors and resistors it is frequently required to create a thin electrically conductive film on an electrically insulating substrate. The need for a thin film is for economy of conductive material as well as permitting the overall volume of the component to be reduced and giving better electrical properties. One way in which this film may be laid down is by depositing a metallic paint by a silk screen printing process and then firing this paint to give the required conductive layer. The silk screening process is capable of giving a fairly accurate location of the printed region on the substrate and may be arranged to provide a special shape of deposit such as a printed circuit pattern.

The amount of fine detail that may be reproduced by this silk screen process however is limited by the need generally to slightly distort the screen during the printing operation and also by the actual mesh size of the screen used. The use of a very fine mesh size causes a correspondingly undesirable reduction in the physical strength of the screen. Where a conductive area of complex and detailed shape is required it has not been found easy to obtain the required accuracy with conventional silk screening techniques.

Any further refinements of the silk screening process that might be made do not appear to be able to meet the general increasing need for miniaturization in the construction of electrical components.

The present invention provides an alternative method of depositing a conductive film which is capable of giving good definition.

According to one feature of the invention a method of making an electrical or electronic component comprises the step of depositing an electrically conductive film on a substrate surface by a dry printing process. The dry printing process may comprise the use of a thin foil coated on one side with material required to be used to form the electrically conductive film, the foil being capable of being pressed against the substrate with a suitably shaped die causing the transfer of film-forming material from the foil to the substrate. The transfer may be facilitated by means such as heating of the die or control of the pressure required for the transfer operation. A combination of heating and pressure has been found to be particularly suitable for effecting the transfer. The invention also comprises an electrical or electronic component such as a resistor, a capacitor or a thick film circuit when constructed by this method and apparatus for effecting construction of the component. The invention is also applicable to depositing conductive areas of the thin film type where the conductive film will be laid down on the foil by an evaporation process.

Figure 2:
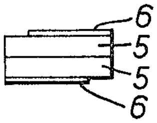
Figure 3:
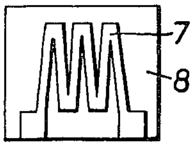
Figure 4:
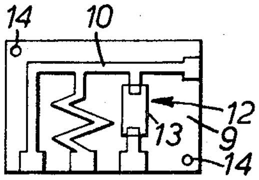

By way of example embodiments of the invention will be described with reference to the drawings accompanying the specification in which:

FIG. 1 shows apparatus used for depositing an electrically conductive layer on a substrate according to the invention, FIG. 2 is a cross-sectional view of a capacitor, FIG. 3 is a resistor, and FIG. 4 is a printed circuit embodying two electrical components.

One form of apparatus used for carrying out the process according to the invention comprises a die 1 having on one face thereof a raised character 2 or design which is in the shape that is required for the electrically conductive film to be formed on the substrate. The die may be maintained at an elevated temperature by means of a heating element. The die 1 may be pressed against a thin foil 3 which carries a conductive layer 4. When a substrate 5, which may be a small plate of unfired barium titanate ceramic, is held beneath the foil 3 and the die pressed down towards the substrate, a portion of the conductive layer 4 in the shape of the character 2 on the die face will become transferred and will leave a conductive film 6 on the surface of the substrate 5. The substrate 5 may now be fired to form a strong plate of barium titanate ceramic and during this process the conductive film 6 will be caused to bond to the ceramic and provide the required electrically conductive film.

This apparatus was used to prepare a number of electrically conductive films supported on substrates for test purposes. The substrates used were barium titanate powder lightly compacted to a green state using as a binder an ethyl cellulose solution. A thin foil 3 of a polyester film was used to support a conductive layer 4 of palladium powder incorporated with a binder and coated on the foil by a roller comb technique. Before coating the film with the powder the relevant side of the film was treated with a suitable sizing preparation and this treatment was repeated after the coating step. The sizing treatment ensured that the conductive layer would separate from the film under the action of the die 1 and adhere to the substrate.

A die 1 having a suitable pattern on its surface for the production of electrodes for miniature capacitors was maintained at a temperature of 100° C. When the foil with its conductive layer was pressed between the die and the substrate the required transfer of palladium powder was made under these conditions to the surface of the substrate. The substrate 5 with its deposited conductive area was then superimposed on a similar substrate so that the electrode areas were on the outside of the arrangement as shown in FIG. 2. The resulting stack was lightly pressed together and then fired so that the electrode areas became united to the substrates and the substrates themselves bonded together to form capacitor having roughly the same cross-sectional appearance as that of FIG. 2. The overlapping portions of conductive film on the surface of the substrates thus formed electrodes of a capacitor and suitable conductive leads could be attached to these electrodes to enable the capacitor to be connected in circuitry for testing.

It was found that conductive films deposited by the aforementioned method show good continuity over their whole areas and it was noted that there was an absence of holes in the conductive films which appeared to be an advantage over electrodes that had been deposited by the silk screening process. In the latter process, holes may occur in the deposit due to the necessary presence of the mesh through which the conductive material must pass and these holes may cause a loss in the capacitance as high as 20 percent when compared with a capacitor having electrodes without such holes.

FIG. 3 shows a shape of a film 7 that was deposited on a substrate 8 where it was required to fabricate an electrical resistor.

FIG. 4 shows a further substrate 9 carrying a thick film circuit pattern 10. The thick film circuit pattern 10 includes a resistor 11 which is similar in shape to that of FIG. 3. Where it is required to have for example a resistor of a very high resistance value it may be inconvenient to use the extended path construction for the resistor as shown in this example. The thick film circuit pattern 10 therefore shows another construction which may be used for forming a large resistor 12. This large resistor 12 is formed by making a break in the electrode path form the thick film circuit then, in a further dry printing process, bridging across this gap in the printed circuit with an area 13 of high resistance material. This area 13 may be laid down on the substrate surface in a separate dry printing operation before or after the main electrode for the circuit is deposited and this is done by means of a suitable foil having a conductive layer 4 which will give high resistance in conjunction with a suitable die to determine the necessary shape and location of this electrode. One method of achieving good registration where it is require to print more than one electrode type on a given substrate is by means of registration holes 14 which may be used to locate the substrate on the platen of a dry printing press.

The dry printing process as outlined has been found to permit accurate registration of the position of conductive films on the substrate and such films may be laid down with good definition even when the films are of complex and detailed shapes.

The foregoing descriptions of embodiments of the invention have been given by way of example only and a number of modifications may be made without departing from the scope of the invention. For instance the dry printing method may be used for depositing films on fired or unfired ceramics. The method of depositing the conductive film on the thin foil by means of a roller comb has been given as an example and would of course give a film on the substrate of the thick film type. If alternatively the conductive film was deposited by evaporation on the thin foil then a circuit of the thin film type would be formed. The material used to form the conductive film will generally be a metal such as a noble metal or alloy thereof which will not lose its conductive properties after any subsequent treatment such as firing which the substrate may require. As examples of suitable film metals, the metals silver, aluminum, gold, nickel and platinum have been used in addition to the palladium metal which has been already mentioned.

What we claim is:

1. A method of making an electrical or electronic component, the method comprising the steps of roller coating a supporting substrate with a mixture containing particles of an electrically conductive material, inserting the coated supporting substrate between a die and the surface of a substrate which forms the base of said component and compressing the coated supporting substrate between the die and the base substrate to cause a required pattern of the mixture containing particles of electrically conductive material to be applied to the surface of the base substrate.

2. A method as claimed in claim 1, in which the die is provided with a raised portion corresponding to the pattern required to be applied to the base substrate.

3. A method as claimed in claim 1, in which the die is heated at the same time as the coated supporting substrate is compressed between the die and the surface of the base substrate.

4. A method of making an electrical or electronic component, the method comprising the steps of roller coating a supporting substrate with a mixture containing particles of palladium powder, inserting the coated supporting substrate between a die and a surface of a base substrate consisting of barium titanate powder lightly compacted in the green state, said base substrate forming the base of said component, compressing said coated supporting substrate between said die and said base substrate to cause a required pattern of said mixture to be applied to said surface of said base substrate and firing said base substrate having said pattern thereon to afford a substrate of barium titanate ceramic having an electrically conductive film of palladium on a surface thereof.

* * * * *